United States Patent [19]

Ushikubo et al.

[11] Patent Number: 4,927,069

[45] Date of Patent: May 22, 1990

[54] SOLDERING METHOD CAPABLE OF PROVIDING A JOINT OF REDUCED THERMAL RESISTANCE

[75] Inventors: Takao Ushikubo, Kawagoe; Yasuhiro Iwasa, Wako; Yukinori Yamaji, Yamagata, all of Japan

[73] Assignee: Sanken Electric Co., Ltd., Saitama, Japan

[21] Appl. No.: 377,906

[22] Filed: Jul. 10, 1989

[30] Foreign Application Priority Data

Jul. 15, 1988 [JP] Japan .............................. 63-176386
Mar. 17, 1989 [JP] Japan .............................. 1-65671
Mar. 17, 1989 [JP] Japan .............................. 1-65672

[51] Int. Cl.$^5$ .......................... B23K 1/12; B23K 31/02
[52] U.S. Cl. .................................. 228/123; 228/124; 228/180.2; 228/224; 228/243; 228/248
[58] Field of Search ............... 228/123, 124, 180.2, 228/179, 224, 243, 248, 237

[56] References Cited

U.S. PATENT DOCUMENTS

| | | | |
|---|---|---|---|
| 3,879,837 | 4/1975 | Mizukoshi et al. | 228/123 |
| 4,103,814 | 8/1978 | Nishioka | 228/180.2 |
| 4,342,090 | 7/1982 | Caccoma et al. | 228/180.2 |
| 4,810,672 | 3/1989 | Schwarzbauer | 228/180.2 |
| 4,819,857 | 4/1989 | Mizuishi et al. | 228/124 |
| 4,824,006 | 4/1989 | Shimizu | 228/248 |

FOREIGN PATENT DOCUMENTS

| | | | |
|---|---|---|---|
| 45077 | 3/1984 | Japan | 228/180.2 |
| 125025 | 6/1986 | Japan | 228/123 |

OTHER PUBLICATIONS

IBM Technical Disclosure Bulletin, Hayunga et al., p. 1653, vol. 9, No. 11, Apr. 1967.

*Primary Examiner*—Nicholas P. Godici
*Assistant Examiner*—Samuel M. Heinrich
*Attorney, Agent, or Firm*—Woodcock Washburn Kurtz Mackiewicz & Norris

[57] ABSTRACT

A soldering method is disclosed as adapted for attaching semiconductor devices such as transistors to their lead mounts. A layer of a solder paste, premixed with rosin flux, is first printed or otherwise formed on each of a series of interconnected semiconductor mounts which may be in the form of a sheet metal punching. The semiconductor devices are placed on the respective solder layers. Then the solder layers are heated to a prescribed temperature higher than both the melting point of the solder and a flux activation temperature at which the flux starts bubbling within the solder. For thus heating the solder layers, the series of semiconductor mounts with the semiconductor devices placed thereon via the solder layers may be fed longitudinally over a suitably heated surface. Upon lapse of a preassigned length of time following the activation of the flux, a compressive is exerted on the successive solder layers, thereby driving of the gas bubbles generated by the flux for the provision of joints of reduced thermal resistance.

15 Claims, 11 Drawing Sheets

SOLDERING METHOD CAPABLE OF PROVIDING A JOINT OF REDUCED THERMAL RESISTANCE

BACKGROUND OF THE INVENTION

Our invention relates to a method of soldering two surfaces together with a view to the reduction of the thermal resistance of the soldered joint. The soldering method of our invention is particularly well suited for attaching electronic devices such as transistors, diodes, and integrated circuits to their mounts, although we do not wish our invention to be limited to this particular application.

Semiconductor appliances for power-handling applications are used widely in which the semiconductor devices are soldered to mounts made of, for example, sheet metal capable of high heat dissipation. Such sheet metal mounts formed in one piece with external leads for the semiconductor devices are referred to as lead mounts. A serial interconnection of such lead mounts, available in one form as a sheet metal punching, is collectively referred to as a lead frame.

A typical conventional method of soldering such semiconductor devices to sheet-metal lead mounts has been such that layers of a solder paste are formed, as by screen printing, on the respective mounts. Then the semiconductor devices are placed on the solder paste layers. Then the solder is heated and then allowed to solidify.

Heat dissipation is among the primary requirements of the soldered joints between such semiconductor devices and their mounts. The soldered joints must therefore be as low in thermal resistance as set forth hereafter. The thermal resistance of a soldered joint is known to decrease approximately in proportion with its thickness or with the amount of gas bubbles that are generated by the flux in use with the solder and entrapped in the joint.

As far as we know, only prior art approach to this problem has been to decrease the thickness of the soldered joint. To this end the semiconductor device has been rubbed against the mount via the solder layer, either manually or mechanically. Manual rubbing is of course objectionable by reasons of too much labor, time and expenses involved. We also object to mechanical rubbing because of the complex and expensive machinery required.

SUMMARY OF THE INVENTION

We have hereby invented how to reduce the thermal resistance of a soldered joint through reduction of the gas bubbles entrapped therein.

Briefly, our invention may be summarized as a method of soldering two members together, which comprises placing a body of solder together with a flux between the two members. Then the solder and the flux are heated to a prescribed temperature above the melting point of the solder and above a flux activation temperature at which the flux generates a gas. Then, after maintaining the solder and the flux at the prescribed temperature for a preassigned length of time, a compressive force is exerted on the solder body through at least either of the two members in order to drive off the gas bubbles generated by the flux from the molten body of solder.

It should be noted that the compressive force is applied not immediately but upon lapse of the preassigned length of time after the solder has been heated to the prescribed temperature. The solder has been only under the weight of the overlying semiconductor device or equivalent member until the application of the compressive force. Since the molten solder is practically uncompressed during this period, the gas bubbles generated by the flux are easier to escape from the solder body. Then, as the compressive force is exerted on the molten solder upon lapse of the preassigned length of time, the remaining gas bubbles can be substantially wholly expelled therefrom. Upon subsequent solidification the solder provides a joint of drastically reduced thermal resistance.

The above and other features and advantages of our invention and the manner of realizing them will become more apparent, and the invention itself will best be understood, from a study of the following detailed description taken together with the appended claims, with reference had to the attached drawings illustrating some preferred examples of the inventive method.

DETAILED DESCRIPTION OF THE INVENTION

Figure 1:
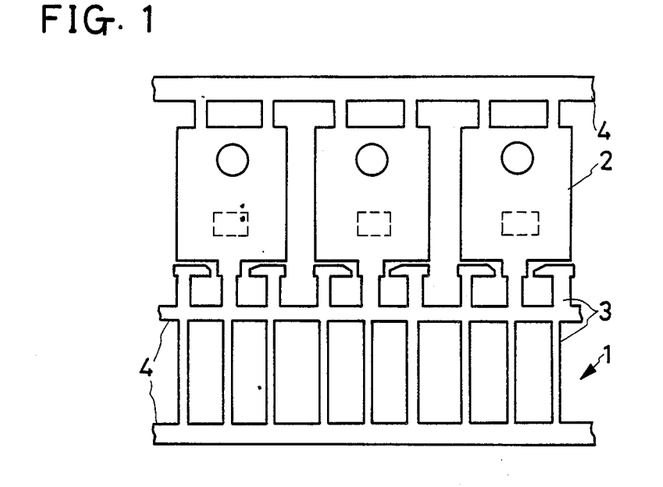
FIG. 1 is a fragmentary plan view of a lead frame to which semiconductor devices are to be soldered by the method of our invention.

We will now describe the method of our invention more specifically in terms of several Examples we conducted for soldering semiconductor devices (transistors) to their lead mounts. As is well known in the art, the lead mounts for such semiconductor devices are supplied in the form of what is known as a lead frame illustrated in FIG. 1 and therein generally designated 1. The lead frame 1, which may be a punching of solderable sheet metal, comprises a series of mounts 2 of generally rectangular shape. The mounts 2 have leads 3 for electrical connection to the electrodes of the semiconductor devices soldered thereto. All the mounts 2 are interconnected by three connective strips 4 extending longitudinally of the lead frame. The semiconductor devices are to be attached to those regions of the mounts 2 which are indicated by dashed outlines. We used the same lead frame in all the Examples set forth hereafter.

EXAMPLE I

Figure 2:
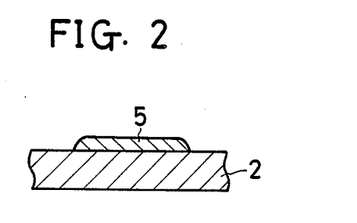
FIGS. 2, 3, 5 and 6 are a series of fragmentary sectional views showing the sequential steps of soldering semiconductor devices to the lead frame of FIG. 1 in accordance with a first example of the inventive method.

FIGS. 2–6 are illustrations of the sequential steps we followed for soldering semiconductor devices to the lead frame 1 by way of a first Example of the method of our invention. First, as illustrated in FIG. 2, we formed layers of solder 5 by screen printing on the dashed regions of the mounts 2. The solder in use here was a paste of a eutectic alloy of lead and tin, premixed with rosin flux. We recommend the screen printing of the solder layers 5 on the mounts 2 by reason of the ease of controlling their thickness.

Figure 3:
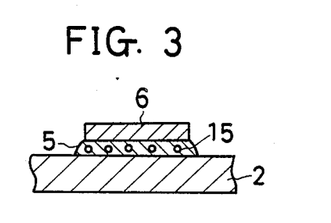

Then, as illustrated in FIG. 3, we placed the semiconductor devices 6 on the solder layers 5 under some light pressure. The solder paste was sufficiently sticky to hold the semiconductor devices 6 thereon against the possibility of tumbling off. With the semiconductor devices 6 placed thereon under pressure, the solder layers 5 were approximately 20 micrometers in thickness. Since the semiconductor devices were transistors, we placed them with their nickel-made collectors held against the solder layers 5, and with their aluminum-made bases and emitters directed away from the solder layers.

Generally speaking, we suggest that the solder layers 5 with the semiconductor devices 6 placed thereon be about 15 micrometers in thickness. The gas bubbles generated by the rosin flux upon subsequent heating of the solder will then more readily escape from the solder layers.

Figure 4:
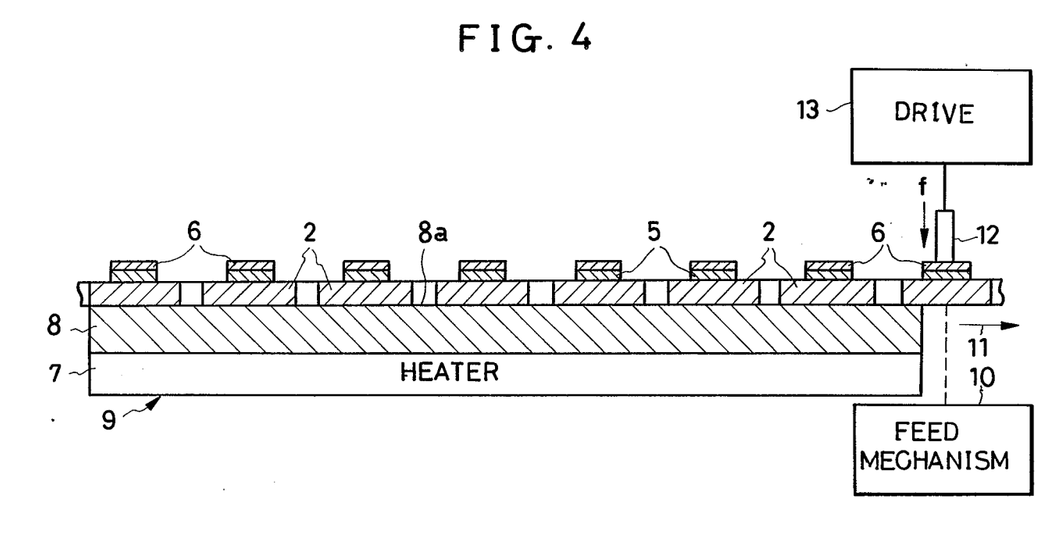
FIG. 4 is a vertical section through a heating apparatus, shown together with the lead frame and semiconductor devices traveling thereon and with means for applying a compressive force to the solder layers between the lead frame and the semiconductor devices, for use in the first example of the inventive method.

Then we heated the solder layers 5. FIG. 4 diagrammatically illustrates an apparatus 9 we employed for heating the solder layers 5. Although we have shown the heating apparatus very diagrammatically because of its largely conventional make, it will nevertheless be understood that it comprised an elongate piece of sheet metal or other material 8 uniformly heated by an underlying electric heater 7. The lead frame 1 with the solder layers 5 and semiconductor devices 6 thereon was fed longitudinally over the flat heating surface 8a of the strip 8 at regular intervals from its entrance end, shown directed to the left, to its exit end in the direction of the arrow 11. In practice, for thus feeding the lead frame 1, an intermittent feed mechanism 10 of any known or suitable construction may be employed in combination with associated jigs. The heating surface 8a should be sufficiently long to permit several mounts 2 to travel thereover at one time, thereby making possible the simultaneous heating of the solder layers 5 on all such mounts.

Figure 7:
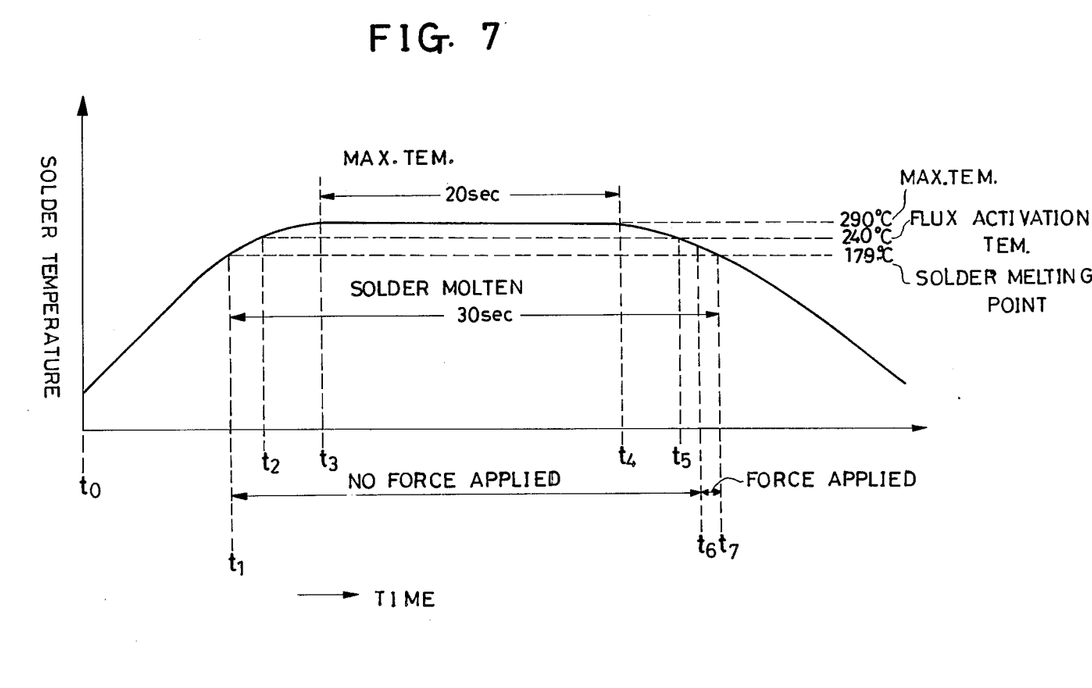
FIG. 7 is a graph plotting the variation in the temperature of the solder layers while the associated semiconductor mounts are traveling over the heating apparatus of FIG. 4.
Figure 8:
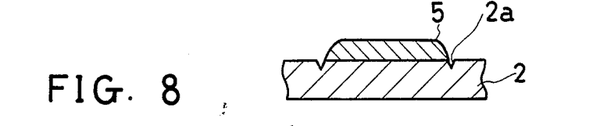
FIGS. 8, 9, 11 and 12 are a series of fragmentary sectional views showing the sequential steps of soldering semiconductor devices to the lead frame of FIG. 1 in accordance with a second example of the inventive method.
Figure 9:
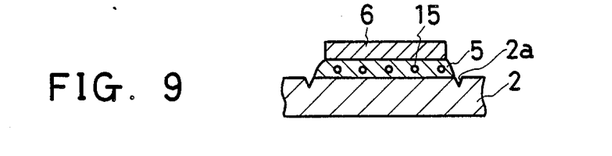

FIG. 7 graphically represents the varying temperature of the solder layers 5 against time as the associated mounts 2 traveled over and past the heating apparatus 9 of FIG. 4. It will be noted that the temperature gradually rose as each mount 2 rode on the heating surface 8a at a time $t_0$ and then reached a melting point (e.g. 179° C.) of the solder at a time $t_1$. Then, at a time $t_2$ shortly after the time $t_1$, the solder layers were heated to a flux activation temperature (e.g. 240° C.) at which the flux contained in the solder started bubbling. Then the solder layers were heated to a maximum temperature (e.g. 290° C.) at a time $t_3$. This maximum temperature was maintained for a prescribed period of, say, 20 seconds until a time $t_4$. Then the solder temperature dropped to the flux activation temperature at a time $t_5$ and further to the melting point at a time $t_7$. The solder started solidifying after the time $t_7$.

It will therefore be seen that the solder was in a molten state from $t_1$ to $t_7$ in FIG. 7. The length of time between $t_1$ to $t_7$ was 30 seconds.

Figure 5:
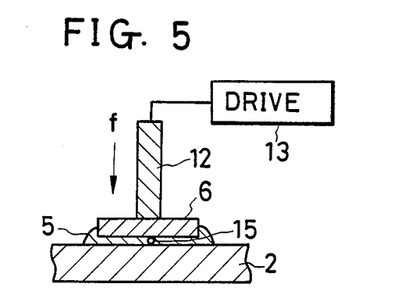

We left the solder layers 5 subjected only to the weight of the overlying semiconductor devices 6 from $t_1$ to $t_6$, the latter being a moment intermediate $t_5$ and $t_7$. Then, during a subsequent brief time interval of $t_6$–$t_7$, we applied a compressive force to the solder layers 5 via the semiconductor devices 6. FIGS. 4 and 5 show at 12 a push member disposed next to the exit end of the heating surface 8a for applying such a compressive force f to each semiconductor device 6 from above immediately as it rode off the heating surface 8a. Any suitable drive mechanism 13 such as that comprising a linear actuator, or a rotary actuator together with a motion translating means, may be coupled to the push member 12.

Figure 6:
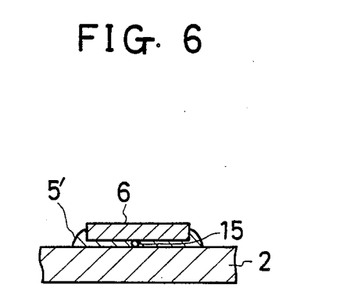

The exertion of the compressive force f on each semiconductor device 6 resulted in the extrusion of part of the solder layer 5 from under the semiconductor device. The thickness of the underlying solder layer 5 became less (e.g. eight micrometers). At the same time, and what is more important, the gas bubbles that had been contained in the solder layers 5 were wholly or nearly wholly expelled from under the semiconductor devices 6. Since the force f was applied to the last moment $t_7$ of the time interval during which the solder had been molten, the solder layers 5 subsequently solidified with their reduced thickness practically unchanged, thereby providing firm joints between mounts 2 and semiconductor devices 6. FIG. 6 shows one such joint 5' of reduced thickness and of reduced thermal resistance obtained upon retraction of the push member 12 out of contact with the overlying semiconductor device 6.

It is, of course, understood that our invention is not to be limited by such disclosure of actual experiments we made. For example, the compressive force f might not necessarily be applied during the time interval $t_6$–$t_7$. According to the broader aspect of our invention, the application of the compressive force may be commenced at any moment following the time $t_2$ when the solder is heated to the flux activation temperature, and terminated after the time $t_7$ when the solder cools to its melting point.

However, in order to realize a high production rate, the time of application of the compressive force should be as short as possible, particularly if the semiconductor devices are to be soldered to the mounts 2 while being intermittently fed over the heating apparatus 9. The solder layers may therefore be subjected to the compressive force during less than the latter half of the total period $t_1$–$t_7$ during which they are molten.

The exertion of the compressive force only during a limited period at or toward the end of time interval $t_1$–$t_7$ during which the solder is molten is an essential feature of our invention. Should the application of the force have been commenced at or about the time $t_1$, the solder layers 5 would have become thin approximately immediately when they started melting. Consequently, the gas bubbles subsequently generated by the flux on activation would have become mostly confined in the solder layers of reduced thickness, resulting in the higher thermal resistance of the joints produced.

In contrast, according to our invention, the solder layers 5 are only under the weight of the semiconductor devices 6 until a certain length of time elapses after the flux activation time $t_2$. The semiconductor devices are so light that the solder layers have had their thickness practically unaffected. Therefore, upon application of the compressive force, the gas bubbles are easier to escape from the solder layers 5.

In order to confirm the advantage of the method of our invention over the prior art, we measured the mounts of the gas bubbles remaining in the joints 5', in terms of ratio of the sum of their areas to the area of each joint in a plane parallel to the principal planes of the mounts 2 and semiconductor devices 6. The total areas of the remaining gas bubbles in the tested joints 5' were less than 5% of the area of each joint. By way of comparison, we formed similar joints by applying the compressive force during the total period $t_1$–$t_7$ when the solder was molten, in accordance with the prior art. The total areas of the gas bubbles remaining in the thus-formed prior art joints were more than 10% of the area of each joint.

We would also like to invite the reader's attention to the fact that the solder layers 5 were heated to the maximum temperature of 290° C., higher than the flux activation temperature of 240° C. This heating of the solder layers to a temperature above the flux activation temperature is intended to accelerate the bubbling of the flux and the consequent escape of some of the bubbles from the solder layers preliminary to the application of the compressive force. Such heating serves the additional purpose of preventing the bubbling of the flux during the subsequent application of the compressive force. We have confirmed by experiment that the solder should be heated to a temperature at least 5° C. higher than the flux activation temperature before application of the compressive force in order to realize the noted advantageous effects.

EXAMPLE II

FIGS. 8–12 are explanatory of the sequential steps we followed for soldering semiconductor devices 6 to their lead mounts 2 by way of a second Example of our method. The details involved in the first two steps of this second Example, illustrated in FIGS. 8 and 9, were exactly the same as those set forth in connection with the FIGS. 2 and 3 steps of Example 1. The only exception was that each lead mount 2 had an annular groove 2a cut in its surface for confining the solder 5 within the required zone.

Figure 10:
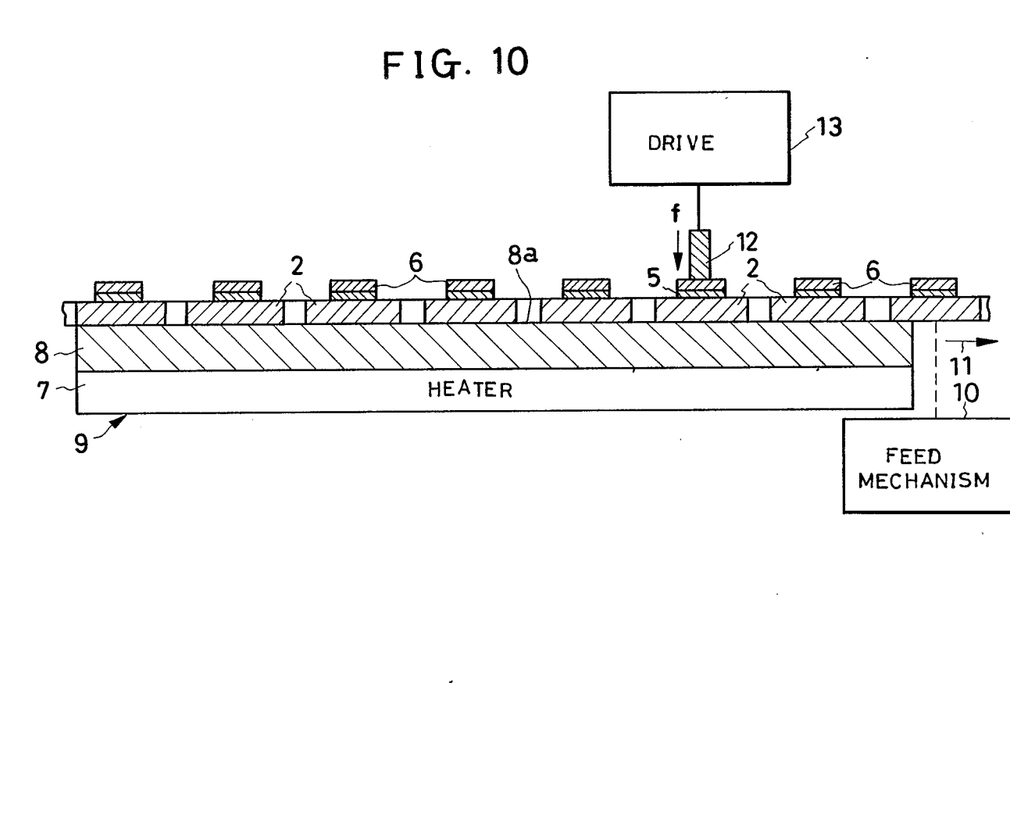
FIG. 10 is a view similar to FIG. 4 but showing the heating apparatus and associated means for use in the second example of the inventive method.
Figure 11:
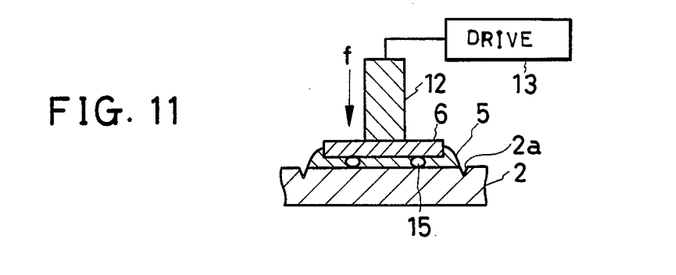
Figure 12:
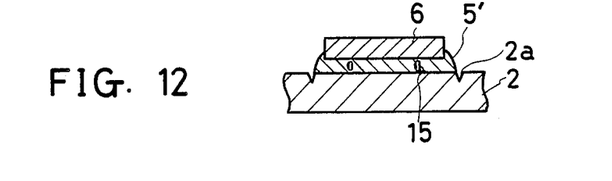
Figure 13:
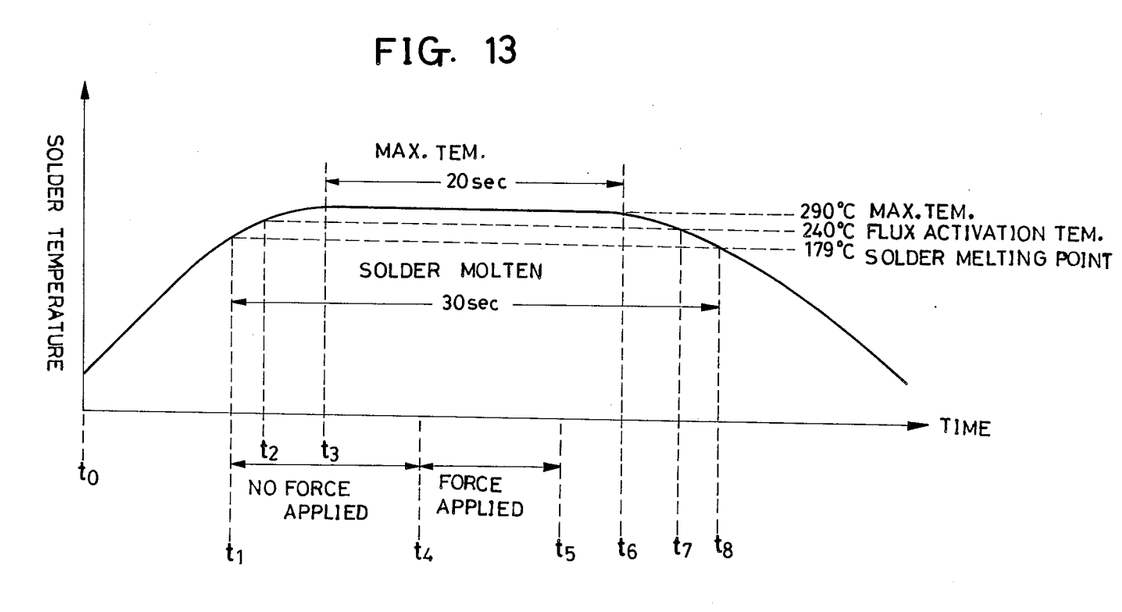
FIG. 13 is a graph plotting the variation in the temperature of the solder layers while the associated semiconductor mounts are traveling over the heating apparatus of FIG. 10.
Figure 14:
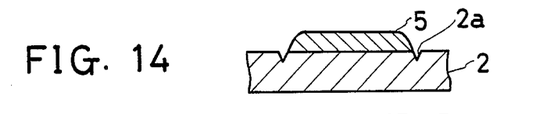
FIGS. 14, 15 and 17–20 are a series of fragmentary sectional views showing the sequential steps of soldering semiconductor devices to the lead frame of FIG. 1 in accordance with a third example of the inventive method.
Figure 15:
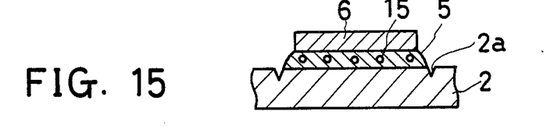

This second Example differs from the first in the timing of the application of the compressive force f depicted in FIGS. 10 and 11. As represented in FIG. 13, we applied the force f to each semiconductor device 6 from time $t_4$ to time $t_5$. The time $t_4$ was after the time $t_3$ when the solder temperature rose to a maximum, and the time $t_5$ was before the time $t_6$ when the solder temperature dropped from the maximum. Thus, as indicated in FIG. 10, the force f was exerted on each semiconductor device by the push member 12 disposed some distance upstream of the exit end of the heating apparatus 9.

A key feature of this second Example of our method is that the solder was released from the force f when still at the maximum temperature. Thereupon that part of each solder layer 5 which had been pushed aside the semiconductor device 6 by the compressive force f, as in FIG. 11, moved back thereunder by virtue of the surface tension of the molten solder. Upon subsequent solidification of the solder, a joint 5' was obtained as pictured in FIG. 12. This joint 5' was thicker than that of Example I shown in FIG. 6. The timing of the application of the compressive force according to the second Example of our method offers the advantages set forth hereafter.

Let us suppose that some gas bubbles 15 remain in the solder 5 when the compressive force f is being exerted on the semiconductor device 6 as in FIG. 11. Such gas bubbles will have been deformed into horizontally elongated shape as the solder have become thin. Therefore, upon subsequent release of the compressive force, the gas bubbles will become either less horizontally elongated, or more or less spherical, or vertically elongated. Either way, the total area of the gas bubbles in any horizontal section through the solder will decrease. Also, some gas bubbles will escape from the solder upon release of the force f when the solder temperature is at the maximum. We have thus succeeded in reducing the total area of the gas bubbles remaining in any horizontal section through the joint 5' to 1% or so of the complete area of the joint in that section.

The solder layer 5 regained a thickness of about 13 micrometers when the compressive force f was released at the time $t_5$. Although there was a corresponding increase in thermal resistance, all such increase could be compensated for by the decrease in the total area of the remaining gas bubbles. We recommend that the push member 12 be moved slowly out of contact with the solder 5 at the time $t_5$, because the solder will then regain its thickness more easily.

THIRD EXAMPLE

Reference may be had to FIGS. 14–22 for a consideration of the sequential steps of soldering semiconductor devices 6 to their lead mounts 2 in accordance with a third Example of our method. The details involved in the first four steps of this third Example, illustrated in FIGS. 14, 15, 17 and 18, were exactly the same as those set forth in connection Example II. Thus, as will be seen from FIG. 21, the compressive force f was exerted on each semiconductor device 6 from time $t_4$ to time $t_5$. The underlying solder layer 5 was allowed to increase its thickness after the time $t_5$.

Figure 21:
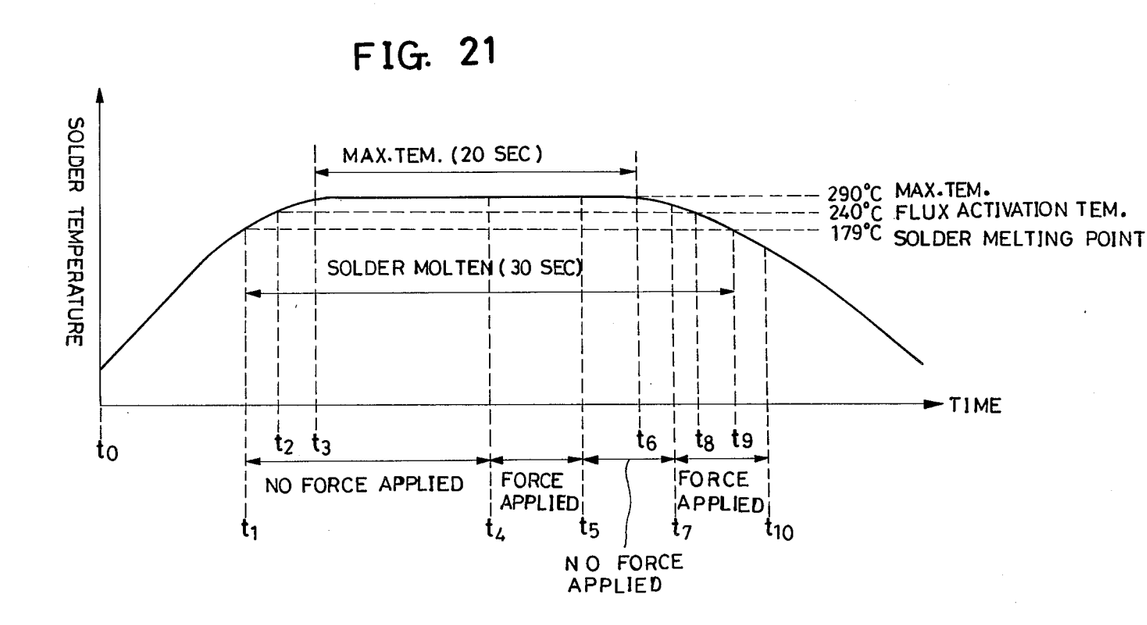
FIG. 21 is a graph plotting the variation in the temperature of the solder layers while the associated semiconductor mounts are traveling over the heating apparatus of FIG. 16.

In this Example III, however, the compressive force f was re-exerted on each semiconductor device 6 from time $t_7$ to time $t_{10}$, as illustrated in FIG. 21. The time $t_7$ was intermediate the time $t_6$, when the maximum temperature period of the solder came to an end, and the time $t_8$ when the flux subsequently cooled to the flux activation temperature. The time $t_{10}$ was shortly after the time $t_9$ when the solder cooled to its melting temperature.

Figure 16:
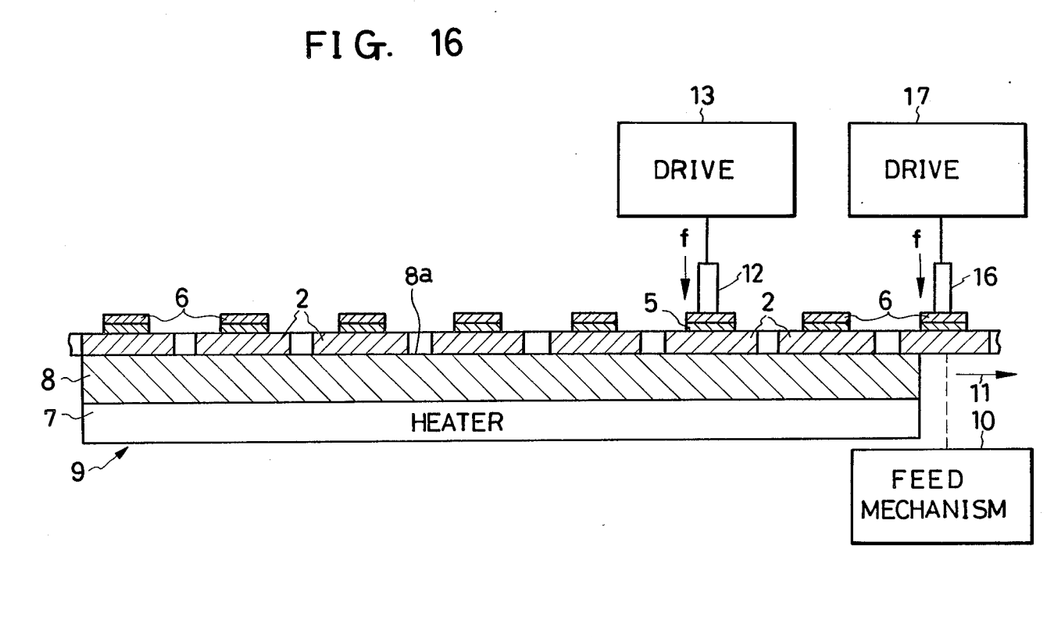
FIG. 16 is a view similar to FIG. 4 but showing the heating apparatus and associated means for use in the third example of the inventive method.
Figure 17:
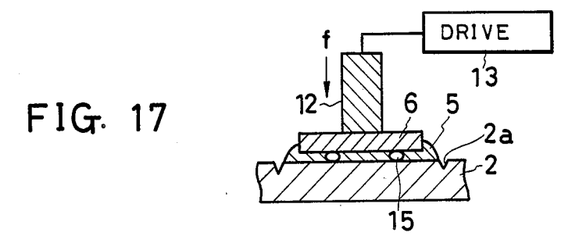
Figure 18:
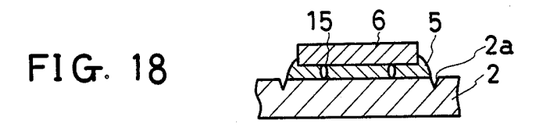
Figure 19:
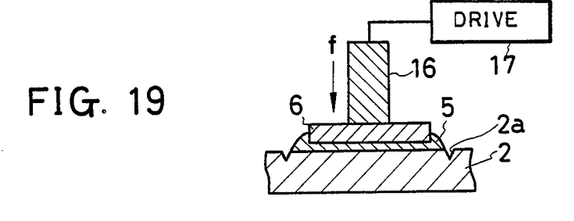
Figure 20:
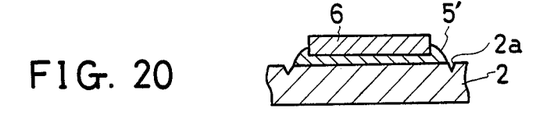

FIG. 16 shows a second push member 16, together with an associated drive mechanism 17, disposed downstream of the first push member 12 for re-exerting the compressive force f. The re-exertion of the force f serves the purpose of expelling any remaining gas bubbles from each solder layer 5. FIG. 20 shows the joint 5' of reduced thickness obtained upon subsequent release of the force f. The gas bubbles could be driven off more completely by applying the force f twice rather than once as in the preceding Examples.

EXAMPLE IV

Figure 22:
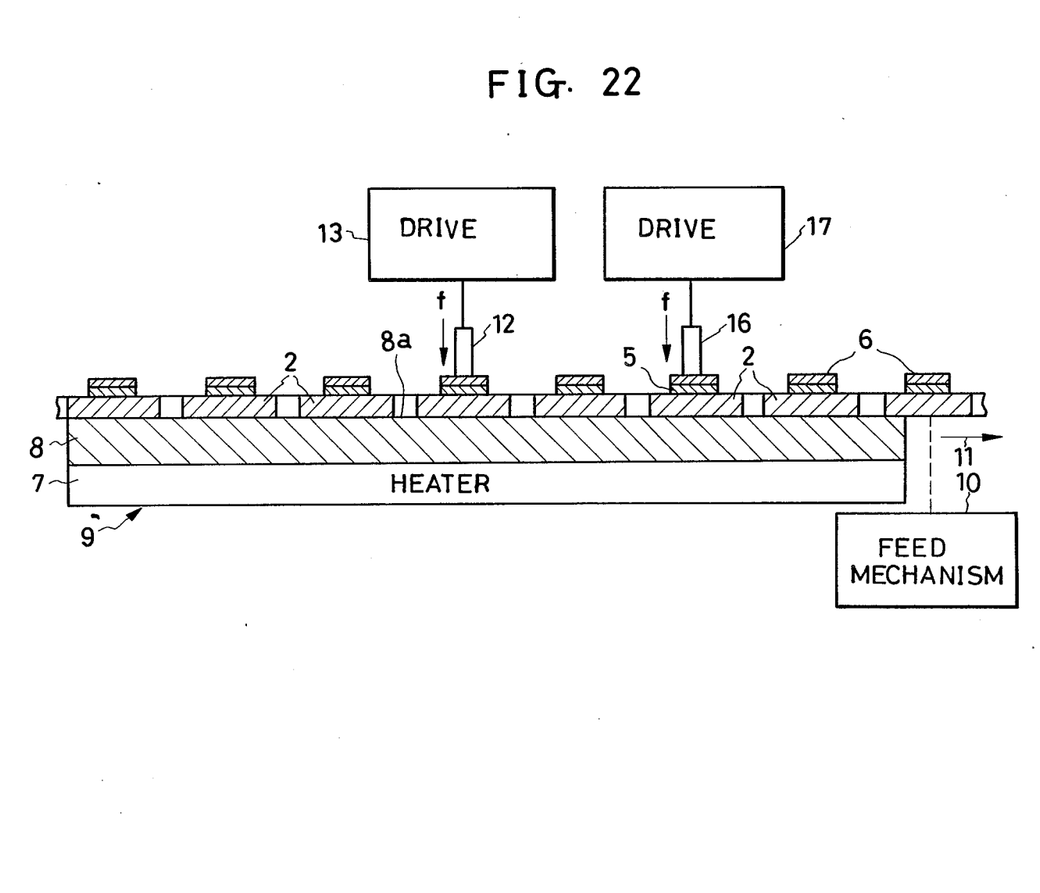
FIG. 22 is a view similar to FIG. 4 but showing the heating apparatus and associated means for use in a fourth example of the inventive method.
Figure 23:
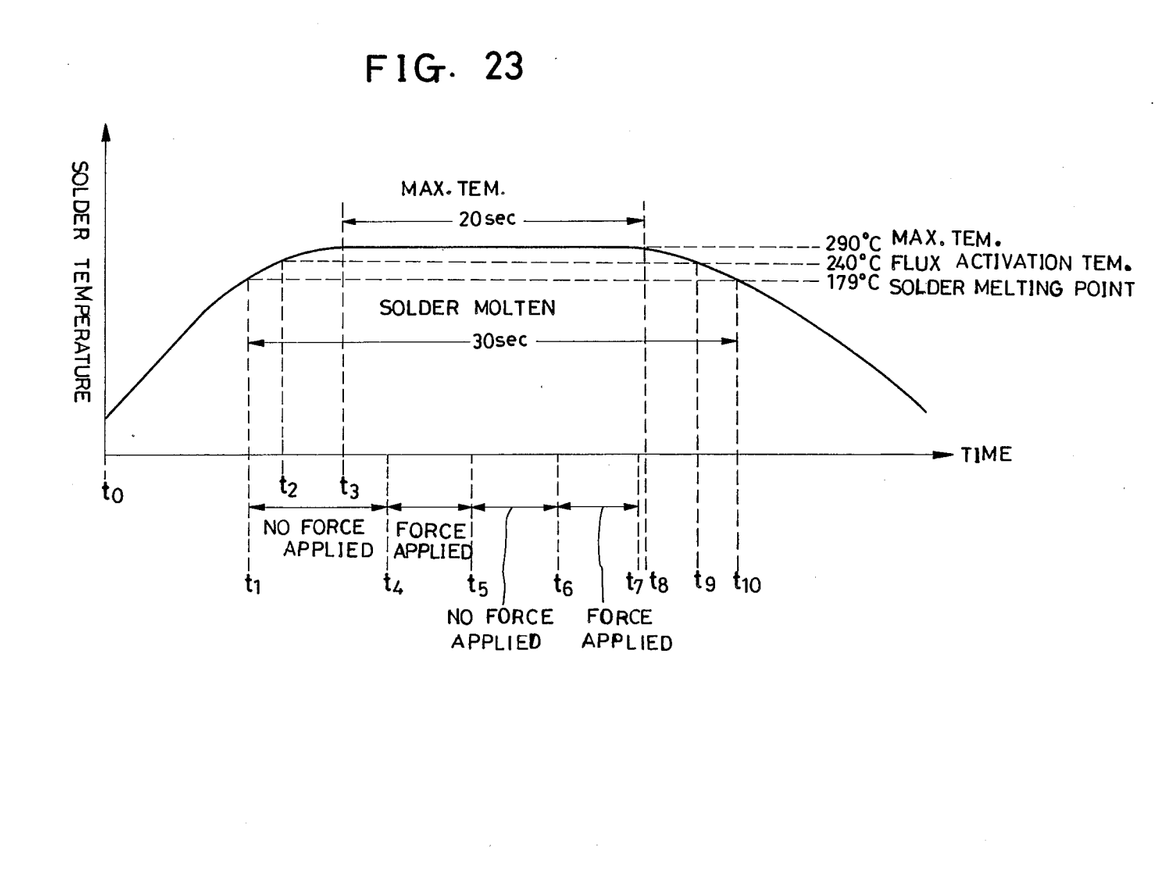
FIG. 23 is a graph plotting the variation in the temperature of the solder layers while the associated semiconductor mounts are traveling over the heating apparatus of FIG. 22.

The fourth Example of our method, illustrated in FIGS. 22 and 23, represents a slight modification of Example III. The compressive force f was applied twice to each semiconductor device 6 while the underlying solder layer 5 was molten, as in Example III, but the second application of the force was from time $t_5$ to time $t_7$ in FIG. 23. It will be seen that both $t_6$ and $t_7$ were within the maximum temperature period $t_3$–$t_8$ of the solder, although the second application of the force f could be terminated at $t_8$.

We have stated in connection with Example II that a drastic reduction in the total area of the gas bubbles remaining in any horizontal section through each joint results upon release of the compressive force f when the solder temperature is at a maximum. The application and release of the compressive force two times during the maximum temperature period of the solder realizes a still more decrease in the total area of the remaining gas bubbles in any horizontal section through each joint 5'.

POSSIBLE MODIFICATIONS

Although we have shown and described our invention as applied to the soldering of semiconductor devices, typified by transistors, to their lead mounts, we do not wish our invention to be limited by this particular application. The method of our invention is applicable to the soldering or brazing of a variety of other electronic devices (e.g. thyristors, diodes and integrated circuits) to their mounting structures, or of any other devices or members to some other devices or members if the solder joints between them are required to be of reduced thermal resistance. Still further, the mounting structures for such electronic devices need not be fabricated solely of solderable metal but may, for example, be a ceramic or other insulating substrate with a solderable metal layer formed thereon.

We further understand that the details in the above disclosed Examples of the soldering method are not to impose limitations on our invention. The following is a brief list of possible modifications or alterations of the Examples which we believe all fall within the scope of our invention:

1. The compressive force f could be applied at any time after the activation of the flux contained in, or added to, the solder. For the best results, however, the force may be applied at least five seconds after flux activation.

2. Only one push member could be employed for applying the compressive force twice to each solder layer in Examples III and IV, although the provision of the two separate push members with the associated drive means is preferred for higher production.

3. Compressive forces of different magnitudes could be applied to each solder in Examples III and IV.

4. An expansive force could be exerted on the solder layers after the release of the compressive force during the molten state of the solder, in order to cause a greater increase in the thickness of each solder layer.

5. The compressive force could be applied by compressed air, by hand, or by any other means.

6. The temperature of the heating apparatus could be varied in its longitudinal direction.

7. The compressive force could be applied three times or more while the solder was molten.

What we claim is:

1. A method of soldering two members together, which comprises:
    (a) placing a body of solder together with a flux between the two members;
    (b) heating the solder and the flux to a prescribed temperature above the melting point of the solder and above a flux activation temperature at which the flux generates a gas;
    (c) maintaining the solder and the flux at the prescribed temperature for a preassigned length of time; and
    (d) exerting a compressive force on the solder through at least either of the two members in order to drive off the gas bubbles generated by the flux from the molten body of solder and hence to provide a joint of reduced thermal resistance.

2. A method of soldering two members together, which comprises:
    (a) placing a body of solder together with a flux between the two members;
    (b) heating the solder and the flux to a prescribed temperature above the melting point of the solder and above a flux activation temperature at which the flux generates a gas;
    (c) maintaining the solder and the flux at the prescribed temperature for a preassigned length of time, with the solder held only under the weight of one of the two members in order to avoid a decrease in the thickness of the molten body of solder and hence to expedite the escape of the gas bubbles generated by the flux from the molten body of solder; and
    (d) exerting a compressive force on the solder through at least one of the two members in order to drive off the remaining gas bubbles from the molten body of solder and to reduce the thickness of the solder body, with a view to the provision of a soldered joint of reduced thermal resistance.

3. The soldering method of claim 2 wherein the compressive force is exerted on the molten body of solder to the last moment when the solder is in a molten state, allowing the solder body to solidify with its reduced thickness unchanged.

4. The soldering method of claim 2 wherein the exertion of the compressive force is terminated when the solder body is still in a molten state, thereby allowing the solder body to re-increase its thickness before being allowed to solidify.

5. The soldering method of claim 4 which further comprises exerting an expansive force on the molten solder body after the exertion of the compressive force thereon, thereby causing a greater increase in its thickness.

6. A method of soldering two members together, which comprises:
(a) placing a body of solder together with a flux between the two members;
(b) heating the solder and the flux to a prescribed temperature above the melting point of the solder and above a flux activation temperature at which the flux generates a gas;
(c) maintaining the solder and the flux at the prescribed temperature for a preassigned length of time, with the solder held only under the weight of one of the two members in order to avoid a decrease in the thickness of the molten body of solder and hence to expedite the escape of the gas bubbles generated by the flux from the molten body of solder;
(d) exerting a compressive force on the solder through at least one of the two members during a preassigned part of the preassigned length of time when the solder is maintained at the prescribed temperature, in order to drive off the remaining gas bubbles from the molten body of solder and to reduce the thickness of the solder body;
(e) releasing the compressive force from the solder before expiration of the preassigned length of time in order to allow the molten body of solder to re-increase in thickness; and
(f) re-exerting a compressive force on the solder through at least one of the two members when the solder is in a molten state, in order to additionally drive off the remaining gas bubbles from the molten body of solder and to reduce the thickness of the solder body again, with a view to the provision of a soldered joint of reduced thermal resistance.

7. The soldering method of claim 6 wherein the solder body is allowed to cool during the re-exertion of the compressive force, with its reduced thickness unchanged.

8. The soldering method of claim 6 wherein the re-exertion of the compressive force is terminated when the solder body is in a molten state, thereby allowing the solder body to re-increase its thickness before being allowed to solidify.

9. The soldering method of claim 6 wherein the compressive forces exerted and re-exerted on the solder during its molten state are of the same magnitude.

10. A method of soldering semiconductor devices to their mounts, which comprises:
(a) providing a series of interconnected semiconductor mounts having solderable surfaces;
(b) forming layers of a solder paste on the solderable surfaces of the semiconductor mounts, the solder paste containing a flux;
(c) placing the semiconductor devices on the solder paste layers;
(d) heating the solder paste layers to a prescribed temperature above the melting point of the solder paste and above a flux activation temperature at which the flux generates a gas, by feeding the series of semiconductor mounts, together with the semiconductor devices placed thereon via the solder paste layers, longitudinally over a heating apparatus; and
(e) exerting a compressive force on the successive solder paste layers via the semiconductor devices thereon while the solder paste layers are in a molten state, thereby driving off the gas bubbles generated by the flux from the solder paste layers and hence to provide joints of reduced thermal resistance between the semiconductor devices and their mounts.

11. The soldering method of claim 10 wherein the heating apparatus has an entrance end and an exit end, and wherein the compressive force is applied by a push member disposed next to the exit end of the heating apparatus, thereby allowing the solder paste layers to solidify with their thickness reduced by the compressive force.

12. The soldering method of claim 10 wherein the heating apparatus has an entrance end and an exit end, and wherein the compressive force is applied by a push member disposed intermediate the entrance end and exit end of the heating apparatus, thereby allowing the solder paste layers to re-increase their thickness upon release of the compressive force.

13. The soldering method of claim 10 wherein the compressive force is exerted twice on each solder paste layer by first and second push members disposed in preassigned positions with respect to the heating apparatus and spaced from each other in the traveling direction of the series of semiconductor mounts over the heating apparatus.

14. The soldering method of claim 13 wherein the heating apparatus has an entrance end and an exit end, and wherein the second push member, disposed downstream of the first push member with respect to the traveling direction of the series of semiconductor mounts over the heating apparatus, is disposed next to the exit end of the heating apparatus for allowing the solder paste layers to solidify with their thickness reduced by the compressive force.

15. The soldering method of claim 13 wherein the heating apparatus has an entrance end and an exit end, and wherein the first and second push members are both disposed intermediate the entrance end and exit end of the heating apparatus for allowing the solder paste layers to re-increase their thickness before being allowed to solidify.

* * * * *